(12) United States Patent
Doblar et al.

(10) Patent No.: US 8,014,159 B2
(45) Date of Patent: Sep. 6, 2011

(54) PRINTED CIRCUIT BOARD WITH OPTIMIZED MOUNTING HOLES AND ALIGNMENT PINS

(75) Inventors: Drew G. Doblar, San Jose, CA (US); Gurpreet S. Dayal, Fremont, CA (US)

(73) Assignee: Oracle America, Inc., Redwood City, CA (US)

( * ) Notice: Subject to any disclaimer, the term of this patent is extended or adjusted under 35 U.S.C. 154(b) by 308 days.

(21) Appl. No.: 12/429,915

(22) Filed: Apr. 24, 2009

(65) Prior Publication Data

US 2010/0271793 A1    Oct. 28, 2010

(51) Int. Cl.
*H05K 5/00* (2006.01)
(52) U.S. Cl. ....................................... 361/752
(58) Field of Classification Search .................. 361/756, 361/759, 741, 727, 686, 788, 737, 684, 752, 361/730, 800, 796, 797; 312/223.1, 223.2
See application file for complete search history.

(56) References Cited

U.S. PATENT DOCUMENTS

| 5,216,578 | A  | * | 6/1993 | Zenitani et al. | 361/690 |
| 5,398,164 | A  | * | 3/1995 | Goodman et al. | 361/752 |
| 5,761,045 | A  | * | 6/1998 | Olson et al. | 361/726 |
| 5,930,118 | A  | * | 7/1999 | Bernhardt et al. | 361/752 |
| 6,561,836 | B1 | * | 5/2003 | Marshall et al. | 439/378 |
| 6,884,096 | B2 | * | 4/2005 | Centola et al. | 439/157 |

* cited by examiner

*Primary Examiner* — Hung S Bui
(74) *Attorney, Agent, or Firm* — March Fischmann & Breyfogle LLP; Libby Huskey; Kent A. Lembke (57) ABSTRACT

A mounting plane assembly (e.g., backplane or midplane) is provided for interconnecting a plurality of daughterboards in a server computer. The mounting plane assembly includes a printed circuit board ("PCB") that has a plurality of shared mounting holes for attaching connector alignment pins to a front side of the PCB as well as mechanical support elements to a back side of the PCB through the same mounting holes.

19 Claims, 6 Drawing Sheets

PRINTED CIRCUIT BOARD WITH OPTIMIZED MOUNTING HOLES AND ALIGNMENT PINS

BACKGROUND OF THE INVENTION

1. Field of the Invention

The present invention relates, in general, to methods and systems for mounting support elements and alignment pins upon printed circuit boards and, more particularly, to a design for utilizing shared mounting holes to mount both support elements and alignment pins to save functional board space as well as to advantageously place the support elements.

2. Relevant Background

To increase computing density and provide optimal data rates, computer servers generally include a number of interconnected printed circuit boards ("PCBs"), often referred to as daughterboards or daughtercards, that provide data processing and storage, power conversion, system control, network connection, and other system computing functions. Depending on the size of the daughterboards and their location within the server, the daughterboards are generally mounted relative to a backplane or a midplane that is mounted within the server chassis (collectively a "mounting plane"). The mounting plane is formed of another PCB that connects several backplane/midplane connectors in parallel with each other. Each pin of each connector is linked to the same relative pin of all the other connectors, forming a physical and electrical common bus that serves as a backbone to connect the daughterboards to form a complete computer system. There are numerous types of commercially available backplane/midplane connectors, and many of these connectors rely on alignment pins to facilitate the mating relationships between the female connectors located on the mounting plane with the corresponding male connectors attached to each daughterboard, or vice versa. In this regard, the alignment pins guide the female and male connectors into alignment to ensure a proper electrical connection.

A mounting plane also generally includes a number of support elements that stiffen the mounting plane to reduce warpage of the board during manufacturing heat cycles and/or solder processes. The support elements or stiffeners also reduce flexing of the board that results from assembly forces that are applied during the process of connecting the daughterboards to the mounting plane via the backplane/midplane connectors. The support elements may also be used to secure the mounting plane to a wall of the server chassis.

The advancement of the computer and electronics industry demands that ever-increasing numbers of electronic components are integrated on single PCBs. In addition, PCBs are expected to continuously shrink in size, meaning that PCBs must accommodate an increasing number of electronic devices with an ever-decreasing footprint. As a result, PCB real estate is expensive and of great value to board designers.

Currently, the connector alignment, pins discussed above are press fit within mounting holes that extend through the mounting plane PCB. Each alignment pin mounting hole is a dedicated hole that serves no other function but to mount a single alignment pin. Similarly, the support elements are fastened to the mounting plane PCB via separate, dedicated support element mounting holes in the mounting plane PCB.

SUMMARY OF THE INVENTION

The inventors have recognized that using separate holes to mount both connector alignment pins and mechanical support elements onto a mounting plane PCB is inefficient, unnecessarily consumes real estate on the PCB, and precludes the support elements from being advantageously located directly opposite the mounting plane assembly connectors so as to more effectively resist the forces applied to the connectors when one or more daughterboards are assembled to the mounting plane. These and other issues are addressed with a mounting plane assembly described below and shown, for example, in FIGS. 1-6.

More particularly, a mounting plane is provided for interconnecting a plurality of daughterboards in a server computer. The mounting plane includes a PCB having a first shared mounting hole therethrough, a connector attached to a front side of the PCB, an alignment pin spaced apart from an end of the connector, and a support element or stiffener attached to the back side of the PCB (e.g., an elongated plate, channel, or other stiffener component(s)). The alignment pin and the support element are attached to the PCB via the shared mounting hole. Variations of the mounting plane may include a first support element mounting hole within the support element. In turn, a proximal end of the alignment pin may extend from the front side of the PCB through the first shared mounting hole and press fit into the first support element mounting hole. In another embodiment, a fastener may be used to attach both the support element and the alignment pin to the PCB. In this embodiment, the fastener may extend through the first support element mounting hole of the support element, through the first shared mounting hole of the PCB, and into the alignment pin. In some embodiments, a pair of alignment pins is provided for each connector on the PCB. The alignment pins extend through mounting holes spaced apart from each end of each connector. Thus, a plurality of alignment pins extend through the PCB and the stiffener(s) so as to mount the stiffener or support element while also providing alignment pins for each of the connectors to facilitate attachment of daughterboards or expansion boards to the PCB. In this manner, the number of mounting holes may be significantly reduced (e.g., the number of mounting holes used may be reduced by about 50 percent or the like).

In addition, a mounting plane assembly is provided that includes a PCB and a plurality of connectors (e.g., female electrical connectors for daughterboards, expansion boards, or the like) attached to a front or first side of the PCB. First and second alignment pins extend from and/or abut the front or first side of the PCB and are spaced apart from first and second ends of each of the connectors, respectively. One, two, or more support, elements are attached to a back side of the PCB, and each of the support elements is attached to the PCB at a point that is directly opposite at least one of the first and second alignment pins (e.g., a first row or set of pins is used to attach a first support element/stiffener to a back or second side of the PCB, a second row or set of pins is used to attach a second support element/stiffener, and so on). Variations of the mounting plane assembly may include a plurality of shared mounting holes within the PCB through which the first and second alignment pins as well as the support elements are attached. In one embodiment, each of the support elements may include a plurality of support element mounting holes. Each of the first and second alignment pins may extend from the front side of the PCB through one of the shared mounting holes and press fit into one of the support element mounting holes to attach the support element(s) to the back or second side of the PCB opposite/proximate the ends of the connectors.

In another embodiment, a plurality of fasteners may be used to attach both the support elements and the alignment pins to the PCB. In this embodiment, the fasteners may extend through the support element mounting holes of the support elements, through the shared mounting holes of the PCB, and into the alignment pins (e.g., the mounting holes are "shared" in the sense that they are each used to mount an alignment pin and a section of a support element/stiffener to the PCB). The fasteners may be of any appropriate size, shape, type, and/or configuration and may be threaded or self-tapping. If threaded, the fasteners may threadably engage with a threaded hole in each of alignment pins, and if self-tapping, the threaded fasteners may bore directly into the alignment pins. In addition, the alignment pins may be flush with the front side of the PCB, or they may extend partially through the shared mounting holes.

A server computer is also provided in some embodiments. The server includes a chassis and a mounting plane assembly positioned within the chassis. The mounting plane assembly includes a PCB having front and back sides and a plurality of shared mounting holes. A plurality of daughterboard connectors are attached to the front side of the PCB, and a pair of alignment pins is associated with each of the daughterboard connectors. Support elements are attached to the back side of the PCB, and fasteners secure the alignment pins and the support elements to the PCB through the shared mounting holes. Daughterboards connect to the PCB via the daughterboard connectors with alignment provided at each end/edge by a pair of the alignment pins associated with each of the connectors. The mounting plane assembly may be a backplane assembly or a midplane assembly depending on the size and position of the daughterboards interconnected to the assembly. In addition, the daughterboard connectors may be male or female connectors that are configured to mate with corresponding female or male connectors, respectively, that are attached to the interconnected daughterboards.

DETAILED DESCRIPTION OF THE PREFERRED EMBODIMENTS

Briefly, embodiments of the present invention are directed to a mounting plane assembly (e.g., a backplane assembly or midplane assembly) for interconnecting several daughterboards within a server computer. The described mounting plane assembly provides shared mounting holes through a PCB of the mounting plane. The shared mounting holes are used to attach more than one assembly component to the PCB via common mounting holes. Using shared mounting holes to attach components such as daughterboard connector alignment pins and mechanical support elements or stiffeners frees-up valuable real estate on the PCB, thereby increasing the effective PCB space available for routing channels, vias, and the like. In addition, using shared mounting holes to mount both the connector alignment pins as well as the mechanical support elements allows the support elements to be advantageously located directly opposite the daughterboard connectors on the PCB. This placement allows the support elements to reinforce the PCB at the precise location where the daughterboard insertion forces are the greatest (i.e., directly opposite the daughterboard connectors), such that the PCB may better accommodate the insertion forces.

Figure 1:
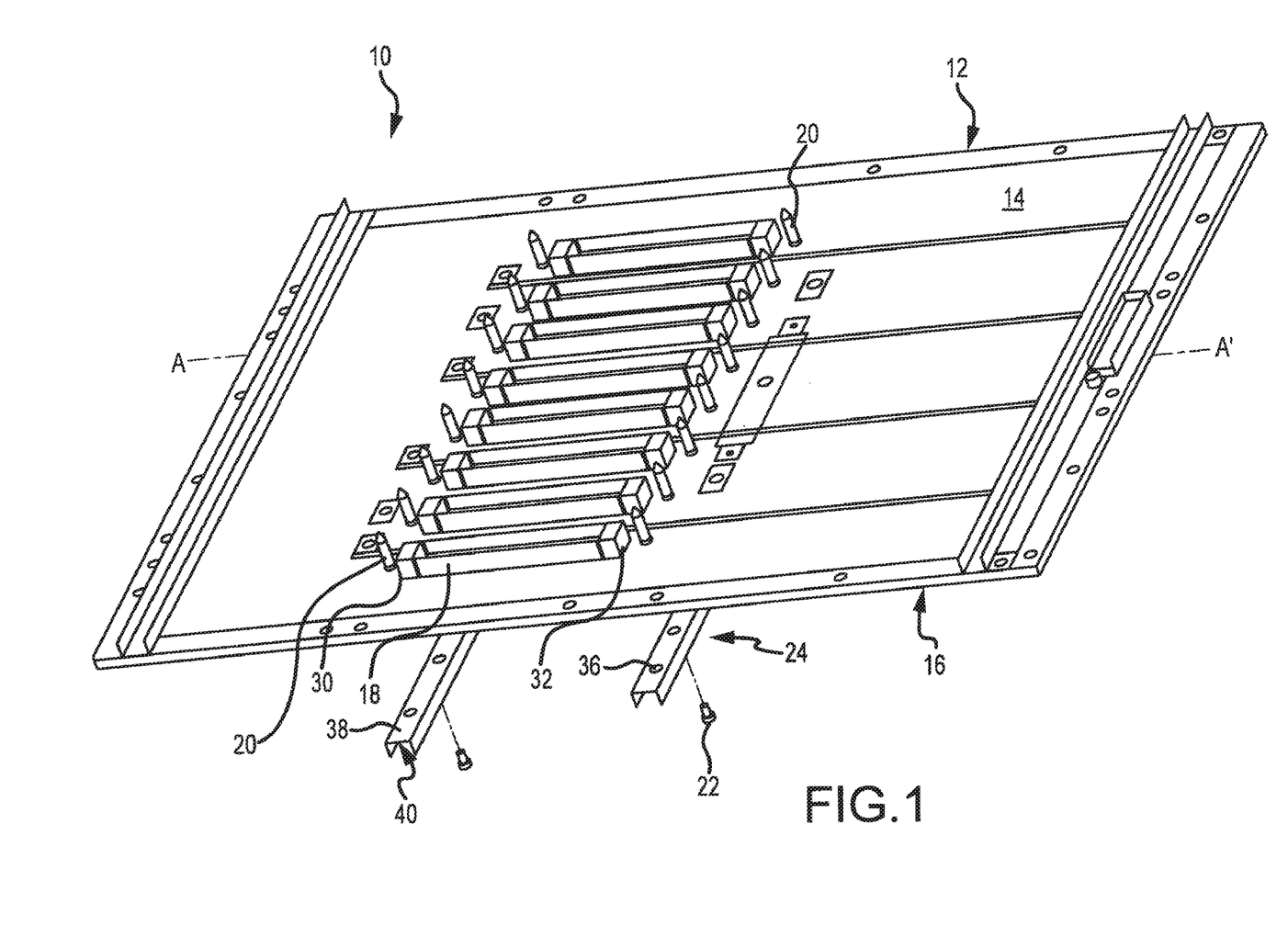
FIG. 1 illustrates a front perspective view of one embodiment of a mounting plane assembly.

FIG. 1 illustrates a front perspective view of one embodiment of a mounting plane assembly 10. As shown, the mounting plane assembly 10 includes a PCB 12 having a front side 14 and a back side 16. For the purpose of illustration, several female daughterboard connectors 18 are attached to the front side 14 of the PCB 12. It should be understood, however, that the daughterboard connectors 18 may be attached to one or both sides of the PCB 12.

Figure 2:
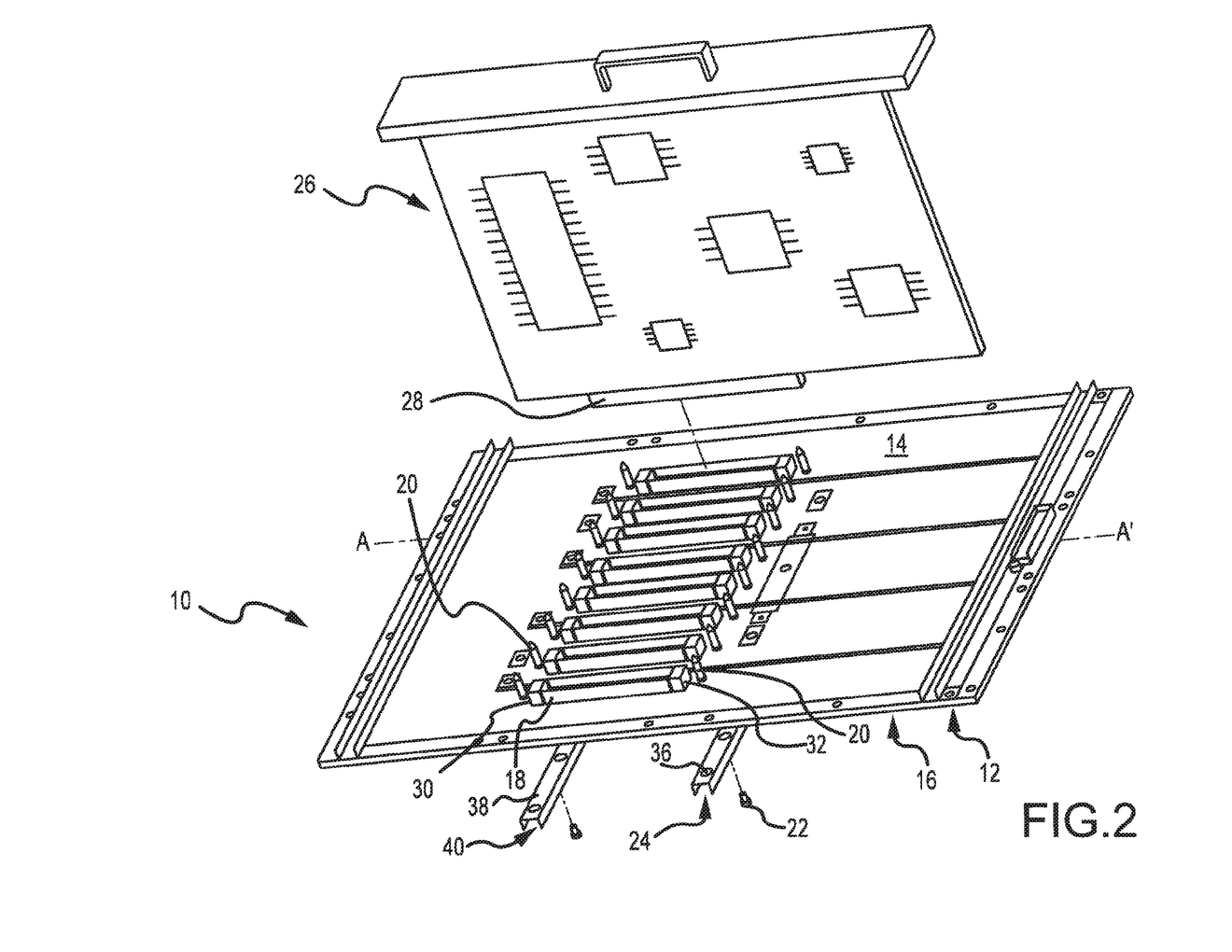
FIG. 2 illustrates a front perspective view of the mounting plane assembly of FIG. 1 with several daughterboards interconnected to the mounting plane assembly.
Figure 4:
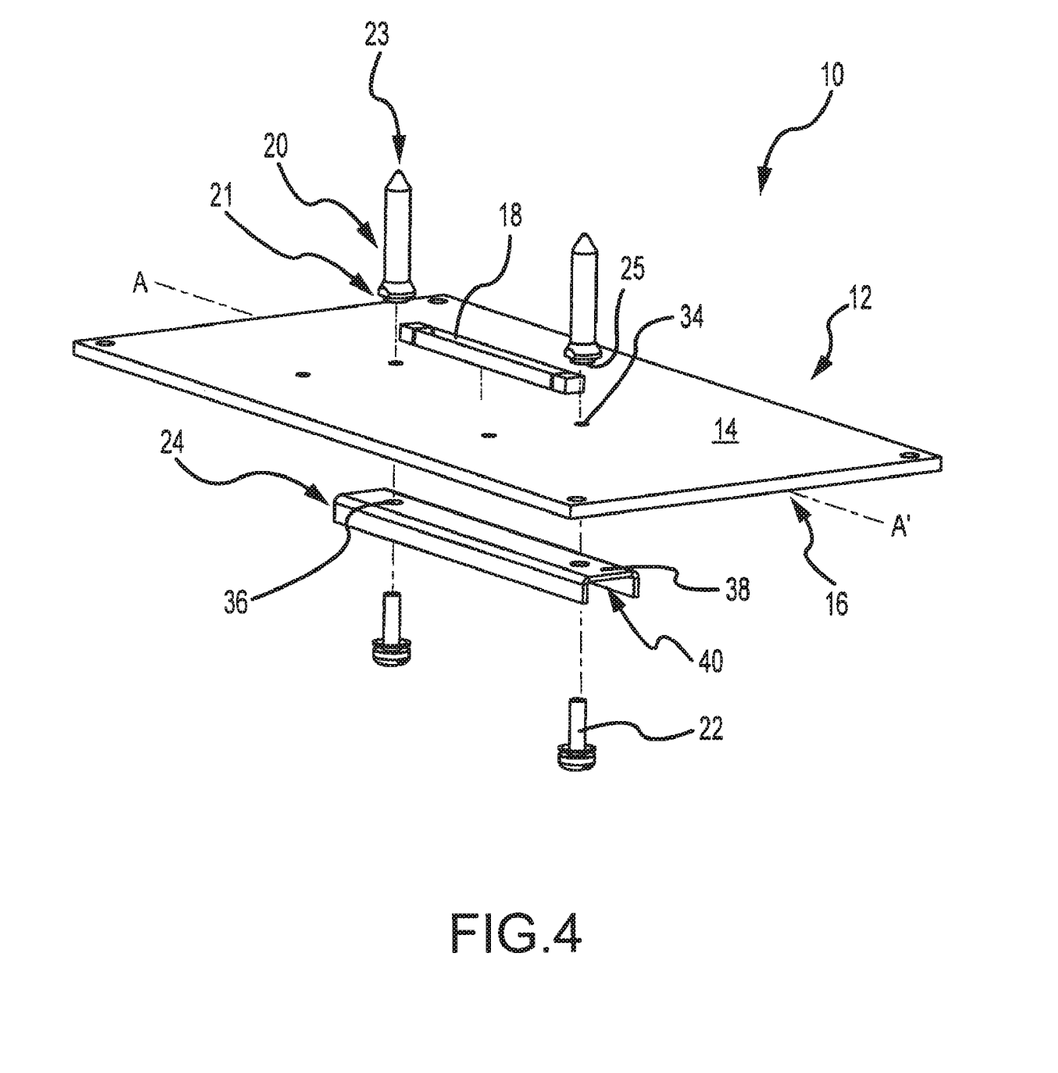
FIG. 4 illustrates an exploded view of the mounting plane assembly of FIG. 1.

As shown in FIG. 2, one or more daughterboards 26 interconnect to one or both sides of the PCB 12 of the mounting plane assembly 10 through the daughterboard connectors 18. In this regard, each daughterboard 26 includes a male mounting plane assembly connector 28 that mates with the corresponding female daughterboard connector 18 on the PCB 12. To assemble each of the daughterboards 26 to the mounting plane assembly 10, an operator aligns the male mounting plane assembly connector 28 of the daughterboard 26 with the corresponding daughterboard connector 18 of the mounting plane assembly 10 and manually presses the two connectors together. To properly align each daughterboard connector 18 with its corresponding mounting plane assembly connector 28, each of the daughterboard connectors 18 is associated with one or more elongated alignment pins 20. In one embodiment, the alignment pins 20 are spaced apart from first and second ends 30, 32 of each daughterboard connector 18. In other embodiments, the alignment pins 20 are located in any appropriate position relative to the array of daughterboard connectors 18 so as to provide for effective alignment of the daughterboards 26. In addition, while FIGS. 1-2 and 4 show the use of two alignment pins 20 for each daughterboard connector 18, greater or fewer alignment pins 20 may be used as appropriate. When an operator assembles the daughterboards 26 to the mounting plane assembly 10, as discussed above, the alignment pins 20 facilitate and guide the male mounting plane assembly connectors 28 into proper mating alignment with the daughterboard connectors 18 on the PCB 12.

It should be understood that while the daughterboard connectors 18 are described as female connectors and the mounting plane assembly connectors 28 as male connectors, this arrangement could be reversed, or the daughterboard connectors 18 could be male connectors while the mounting plane assembly connectors 28 could be female connectors. In addition, the daughterboard connectors 26 and the mating mounting plane assembly connectors 28 may be backplane and/or midplane connectors of any appropriate size, shape, type, and/or configuration (e.g., Molex GbX®, VHDM-HSD® and HDM® connectors or Tyco Electronics Impact™ High Density Backplane Connectors, FCI Backpanel Connectors).

Figure 5:
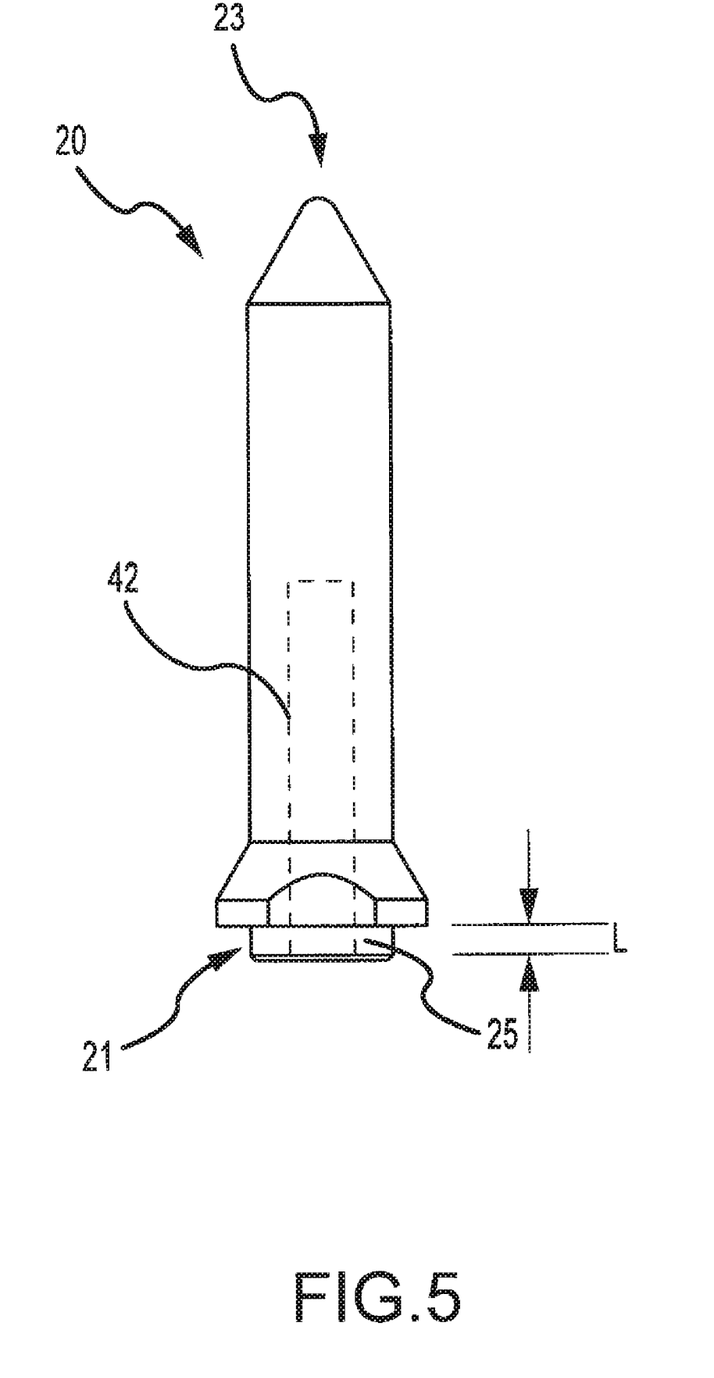
FIG. 5 illustrates a front plane view of one embodiment of an alignment pin for use in the mounting plane assembly of FIG. 1.

FIGS. 4 and 5 illustrate the alignment pins 20 in greater detail. Each alignment pin 20 is formed of an elongated column having a proximal end 21 that abuts the PCB 12 and a distal end 23 that is spaced apart from the PCB 12. The alignment pins 20 may be of any appropriate size, shape, type, and/or configuration. For example, while the alignment pins 20 are shown as having a circular cross-section, the cross-section may be square, triangular, or of any other shape that is appropriately configured to collaborate with and guide the alignment of the mounting assembly connectors 28. The distal end 23 of each of the alignment pins 20 may also be slightly chamfered to further assist in aligning each of the daughterboard connectors 18 with each of the mounting plane assembly connectors 28. The alignment pins 20 may be approximately one inch long and may vary in diameter depending on the configuration of the associated daughterboard connectors 18 and mounting plane assembly connectors 28. The alignment pins 20 may be formed of any appropriate material, including, for example, metal (e.g., aluminum, stainless steel) or plastic (e.g., injection molded or machined plastic). In addition, the alignment pins 20 may be solid or may include a threaded hole 42 (FIG. 5) that extends into the alignment pin 20 from the proximal end 21.

Figure 6:
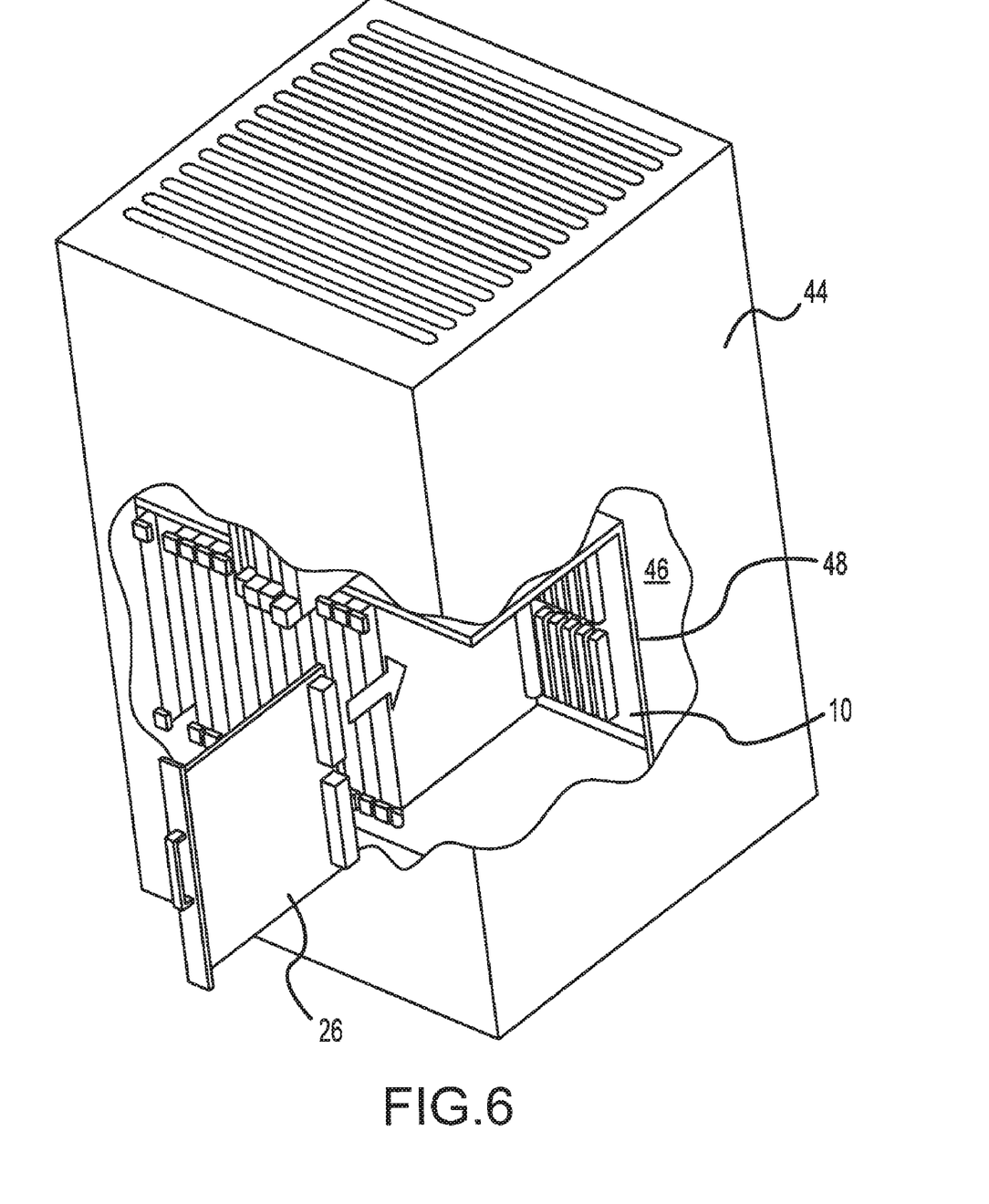
FIG. 6 illustrates a front perspective view of a server computer that includes the mounting plane assembly of FIG. 1 as connected to several daughterboards.

In addition to the alignment pins 20, several support elements 24 may be coupled to the PCB 12, as shown in FIGS. 1-4. The support elements 24 serve several purposes, including acting as mounting brackets for positioning and/or securing the mounting plane assembly 10 within a server chassis 44 (FIG. 6). The support elements 24 may also stiffen the PCB 12 to reduce warpage caused by manufacturing heat cycles and/or solder processes and to reduce flexing of the PCB 12 in response to assembly insertion forces. While the support elements 24 may be of any appropriate size, shape, type, and/or configuration to fulfill these varied purposes, they are generally ten to eighteen inches long to match the width and/or length of the PCB 12, and they are often formed of metal (e.g., aluminum, stainless steel).

Figure 3:
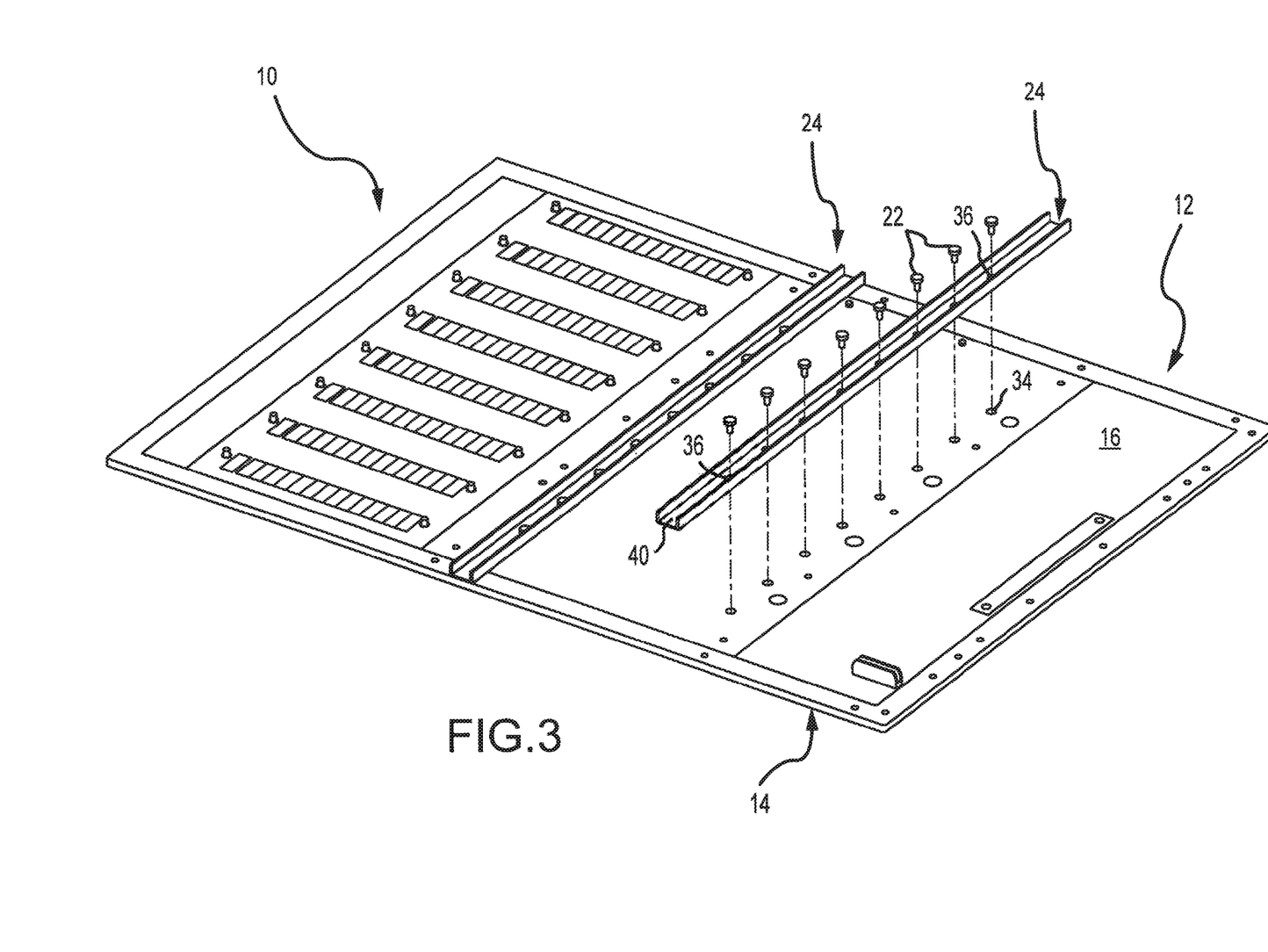
FIG. 3 illustrates a back perspective view of the mounting plane assembly of FIG. 1.

As shown in FIGS. 1-4, each of the support elements 24 has a front side 38, a back side 40, and includes a number of support element mounting holes 36 for attachment to the PCB 12. In this regard, one or more of the support elements 24 may be attached to the back side 16 of the PCB 12 (FIGS. 1-3). The support elements may also be attached to the front side 14 of the PCB 12 or both the front side 14 and the back side 16 of the PCB 12, depending on the design constraints of the server that will ultimately house the mounting plane assembly 10 and the role(s) that the support elements 24 will play. In addition, the support elements 24 may be oriented horizontally in a manner that is perpendicular to a longitudinal axis AA' defined by each of the daughterboard connectors 18 (FIGS. 1-2), vertically in a manner that is parallel to the longitudinal axes AA' (FIG. 4), or one or more support elements 24 may be oriented in a manner that is perpendicular while others are oriented in a manner that is parallel. For example, FIGS. 1-3 show the support elements 24 attached in a manner that is perpendicular to the axis AA'. In this position, the support elements 24 on the back side 16 of the PCB 12 are located directly opposite the alignment pins 20 of several of the daughterboard connectors 18. In other words, the support elements 24 align with or underlie the alignment pins 20 on the opposite side of the PCB 12. In another embodiment, shown in FIG. 4, the support element 24 is attached in a manner that is parallel to the axis A-A', such that the support element 24 underlies an entirety of one of the daughterboard connectors 18. In one embodiment, the support element 24 may be a single-piece element that includes several connected sections that span both the horizontal and vertical portions of the board. Because the support elements 24 vary in use, purpose, and location on the PCB 12, the number and spacing of the support element mounting holes 36 may vary as a function of the length, location, and/or purpose of the particular support element 24.

In instances in which one or more support elements 24 are attached to the back side 16 of the PCB 12 to, for example, counter the insertion forces placed on the daughterboard connectors 18 when the daughterboards 26 are assembled to the mounting plane assembly 10, the support elements 24 are mounted to the PCB 12 directly opposite the alignment pins 20 through a number of shared mounting holes 34, as shown in the exploded view of FIG. 4. Specifically, on the back side 16 of the PCB 12, the support element mounting holes 36 of the support element 24 are aligned with the shared mounting holes 34 of the PCB 12. On the front side 14 of the PCB 12, one of the alignment pins 20 is placed at each of the shared mounting holes 34 of the PCB 12. The proximal end 21 of each of the alignment pins 20 may be flush with the top side 14 of the PCB or, as detailed in FIG. 5, each of the alignment pins 20 may include a lip or hole-mounting portion 25 that may extend into the shared mounting hole 34 for ease in placing and aligning the alignment pins 20. To ensure that the lip 25 extends into the shared mounting hole only to a desired depth, the lip 25 may have a length L that is calculated as a function of the thickness of the PCB 12 as well as the manufacturing tolerances of both the alignment pin 20 and the PCB 12.

In one embodiment, the support elements 24 and the alignment pins 20 are attached to the PCB 12 via a number of fasteners 22 that extend from the back side 40 of the support element 24, through the support element mounting holes 36 of the support element 24, through the aligned shared mounting holes 34 of the PCB 12, and into each of the alignment pins 20. The fasteners 22 may be of any appropriate size, shape, type, and/or configuration. For example, the fasteners may be threaded fasteners that threadably engage with the threaded holes 42 within the alignment pins 20 or, in another embodiment, they may be self-tapping fasteners that bore into the proximal ends 21 of the alignment pins 20. The alignment pins 20 may be flush with the front side 14 of the PCB 12, or the lip 25 of each alignment pin 20 may extend partially through the corresponding shared mounting hole 34 such that the alignment pins 20 may be more quickly and accurately aligned/placed prior to assembly.

In another embodiment, the length L of the lip 25 of the alignment pins 20 may exceed the thickness of the PCB 12. In this embodiment, the lip 25 of the alignment pin 20 may extend through the entirety of the shared mounting holes 34 of the PCB 12 and press-fit within the support element mounting holes 36 of the support element 24, thereby eliminating the need for the separate fasteners 22.

In yet another embodiment, one or more alignment pins 20 may be permanently assembled adjacent to the mounting plane assembly connectors 28 on each of the daughterboards 26. When each daughterboard 26 is assembled to the mounting plane assembly 10, the alignment pins 20 extend from the daughterboard 26, through the shared mounting holes 34 in the PCB 12, through the support element mounting holes 36, and into a receiving portion or receptacle formed within the fasteners 22 that are used to mount the support elements 24 to the PCB 12.

FIG. 6 illustrates the mounting plane assembly 10 as positioned within a server chassis 44 and having several daughterboards 26 assembled thereto. The mounting plane assembly 10 may serve as a backplane assembly if secured to a rear wall 46 of the chassis 44 or a midplane assembly if secured to an intermediate wall 48 within the chassis 44. As a backplane assembly, the mounting plane assembly 10 may interconnect longer daughterboards such as Ethernet cards/routers and/or an I/O board assembly. As a midplane assembly, the mounting plane assembly 10 may interconnect shorter daughterboards such as power supplies and/or a processor board assembly. As discussed above, one or more of the support elements 24 may act as a bracket to secure the mounting plane assembly 10 to the chassis wall. In another embodiment, the mounting plane assembly 10 may be fastened directly to the chassis wall or attached in any other appropriate manner.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed. For example, the alignment pins 20 shown in FIG. 5 may include a shoulder at the proximal end 21 proximate or adjacent to the lip or hole-mounting-portion 25. This shoulder provides a surface to abut the front or first surface 14 of the PCB 12, which facilitates assembly such as by limiting travel of the pins 20 into the shared PCB mounting holes (e.g., holes 34) of the PCB 12. In other cases, the pins 20 may include a body with a larger diameter than the lip 25 to provide the shoulder or abutting portion so as to limit travel into the hole of the PCB 12.

In practice, embodiments may include a PCB that is adapted for later receipt of daughterboards and/or expansion boards. In these embodiments, a PCB may be fabricated or manufactured that includes a set of connectors extending in a row on a front or first surface of the PCB. For each of the connectors, a pair of mounting holes may be provided/formed in the PCB that are proximate to each end of the connectors and that extend through the PCB from the front/first side to a second/back side of the PCB. The PCB may include a pair of stiffeners extending along and abutting the second/back side of the PCB and aligned with the PCB mounting holes. A plurality of fasteners may be used to fasten the stiffeners to the board. These fasteners may be inserted through the stiffeners so as to extend upwards through the PCB and from the first/front side of the PCB. The PCB or PCB assembly may further include a plurality of alignment pins that are affixed to the protruding ends of the fasteners. In some cases, a pair of alignment pins will be provided for each of the connectors and be threaded or otherwise attached to the protruding ends of the fasteners (e.g., screws or the like). The pins may have an end that abuts or contacts the first/front surface of the PCB or they may be spaced apart a distance from the PCB surface. In this manner, the number of mounting holes used for connecting stiffeners and alignment pins to the PCB is typically equal to the number of alignment pins (e.g., twice the number of connectors that use alignment, pins or the like).

In other cases, the alignment pins may have a lip or extending portion that extends through the PCB to protrude outward from the second/back side of the PCB. In these cases, the stiffeners may have their mounting holes aligned with the protruding portion and be held tight by mechanical components such as with nuts or the like threaded onto the protruding portion, with a press/force fit fastener or the like, or by soldering or other techniques.

We claim:

1. A mounting plane for interconnecting daughterboards in a server computer, comprising:
    a printed circuit board having a front side, a back side, and numerous shared mounting holes;
    connectors for daughterboards attached to the front side of the printed circuit board;
    an alignment pin spaced apart from each of the connectors and extending outward from the front side of the printed circuit board; and
    first and second support elements, each having a front side and a back side, wherein the front sides of the support elements are attached to the back side of the printed circuit board, wherein the alignment pins and the support elements are attached to the printed circuit board via the shared mounting holes in the printed circuit board, wherein each of the connectors defines a longitudinal connector axis, the first support element defines a first longitudinal support element axis, and the second support element defines a second longitudinal support element axis, and wherein each of the longitudinal connector axes is parallel to the first and second longitudinal support element axes, perpendicular to the first and second longitudinal support element axes, or parallel to the first longitudinal support element axis and perpendicular to the second longitudinal support element axis.

2. The mounting plane of claim 1, wherein each of the alignment pins has a proximal end and a distal end, wherein the distal end is spaced apart from the front side of the printed circuit board, wherein the first and second support elements each comprise at least a first support element mounting hole, and wherein the proximal ends of the alignment pins extends from the front side of the printed circuit board through the shared mounting holes and press fit into the first support element mounting hole.

3. The mounting plane of claim 1, further comprising fasteners for securing the alignment pins to the front side of the printed circuit board and the first and second support elements to the back side of the printed circuit board, wherein each of the support elements comprises at least a first support element mounting hole, and wherein the fasteners extends through the first support element mounting holes of the support elements, through the shared mounting holes of the printed circuit board, and into ends of the alignment pins that are proximal to the front side of the printed circuit board.

4. The mounting plane of claim 3, wherein the proximal ends of the alignment pin are flush with the front side of the printed circuit board.

5. The mounting plane of claim 3, wherein the proximal ends of the alignment pins extend a distance into the shared mounting holes of the printed circuit board.

6. The mounting plane of claim 3, wherein the proximal ends of the alignment pins each comprises a threaded hole and wherein the fasteners comprise threaded fasteners that threadably engage with the threaded holes.

7. The mounting plane of claim 3, wherein the fasteners comprise self-tapping fasteners that bore into the proximal ends of the alignment pins.

8. A printed circuit board assembly for interconnecting one or more daughterboards in a server computer, comprising:
    a printed circuit board having a front side and a back side;
    an array of connectors attached to the front side of the printed circuit board, wherein each of the connectors has a first end and a second end;
    a first alignment pin spaced apart from the first end of each of the connectors and a second alignment pin spaced apart from the second end of each of the connectors, wherein the first and second alignment pins abut the front side of the printed circuit board; and
    first and second support elements attached to the back side of the printed circuit board, wherein the first support element is attached to the printed circuit board at a point that is directly opposite one of the first alignment pins and the second support element is attached to the printed circuit board at a point that is directly opposite one of the second alignment pins, wherein each of the connectors defines a longitudinal connector axis, the first support element defines a first longitudinal support element axis, and the second support element defines a second longitudinal support element axis, and wherein each of the longitudinal connector axes is parallel to the first and second longitudinal support element axes, perpendicular to the first and second longitudinal support element axes, or parallel to the first longitudinal support element axis and perpendicular to the second longitudinal support element axis.

9. The printed circuit board assembly of claim 8, wherein the first and second alignment pins are attached to the front side of the printed circuit board and the first and second support elements are attached to the back side of the printed circuit board through a plurality of shared mounting holes in the printed circuit board.

10. The printed circuit board assembly of claim 9, wherein the first and second support elements include a plurality of support element mounting holes, and wherein the each of the first and second alignment pins extends from the front side of the printed circuit board through one of the shared mounting holes and press fits into one of the support element mounting holes.

11. The printed circuit board assembly of claim 9, further comprising a plurality of fasteners for securing each of the first and second alignment pins to the front side of the printed circuit board and the first and second support elements to the back side of the printed circuit board, wherein the first and second support elements include a plurality of support element mounting holes, and wherein each of the fasteners extends through one of the support element mounting holes, through one of the shared mounting holes, and into one of the first or second alignment pins.

12. The printed circuit board assembly of claim 11, wherein each of the first and second alignment pins is either flush with the front side of the printed circuit board or extends a distance through one of the shared mounting holes of the printed circuit board.

13. The printed circuit board assembly of claim 11, wherein each of the first and second alignment pins comprises a threaded hole, and wherein the each of the fasteners comprises a threaded fastener that threadably engages with the threaded hole.

14. The printed circuit board assembly of claim 11, wherein each of the fasteners comprises a self-tapping fastener that bores into each of the first and second alignment pins.

15. A computer, comprising:
a chassis; and
a mounting plane assembly positioned within the chassis, the mounting plane assembly comprising:
 a printed circuit board having a front side, a back side, and a plurality of mounting holes extending through the printed circuit board;
 daughterboard connectors attached to the front side of the printed circuit board;
 alignment pins associated with each of the daughterboard connectors;
 first and second support elements attached to the back side of the printed circuit board via the mounting holes, wherein each of the daughterboard connectors defines a longitudinal connector axis, the first support element defines a first longitudinal support element axis, and the second support element defines a second longitudinal support element axis, and wherein each of the longitudinal connector axes is parallel to the first and second longitudinal support element axes, perpendicular to the first and second longitudinal support element axes, or parallel to the first longitudinal support element axis and perpendicular to the second longitudinal support element axis; and
 fasteners for coupling, through the mounting holes, the alignment pins to the first and second support elements.

16. The computer of claim 15, further comprising a daughterboard connected to the printed circuit board via one of the daughterboard connectors, wherein the daughterboard is aligned with the one of daughterboard connectors via the associated alignment pins.

17. The computer of claim 15, wherein the mounting plane assembly comprises a backplane assembly.

18. The computer of claim 15, wherein each of the daughterboard connectors attached to the front side of the printed circuit board is a female connector and wherein the fasteners comprise a threaded end mating with a threaded hole in the proximate ends of the alignment pins.

19. The computer of claim 18, wherein the each of the daughterboards includes a male connector, and wherein the alignment pins associated with each of the female daughterboard connectors of the printed circuit board guide each of the male connectors into proper mating alignment with each of the female daughterboard connectors.

* * * * *